United States Patent
Chin

(10) Patent No.: US 9,978,901 B2
(45) Date of Patent: May 22, 2018

(54) SOLAR CELLS THAT INCLUDE QUANTUM DOTS

(71) Applicant: Soo Fong Chin, Tucson, AZ (US)

(72) Inventor: Soo Fong Chin, Tucson, AZ (US)

(73) Assignee: ADDVENTURE SUPPORT ENTERPRISES, INC., Tucson, AZ (US)

( * ) Notice: Subject to any disclaimer, the term of this patent is extended or adjusted under 35 U.S.C. 154(b) by 0 days. days.

(21) Appl. No.: 14/847,725

(22) Filed: Sep. 8, 2015

(65) Prior Publication Data

US 2017/0069774 A1 Mar. 9, 2017

(51) Int. Cl.
| | |
|---|---|
| *H01L 31/055* | (2014.01) |
| *H01L 31/0352* | (2006.01) |
| *H01L 31/0735* | (2012.01) |
| *H01L 31/054* | (2014.01) |
| *B82Y 20/00* | (2011.01) |

(52) U.S. Cl.
CPC .... *H01L 31/055* (2013.01); *H01L 31/035218* (2013.01); *H01L 31/0543* (2014.12); *H01L 31/0547* (2014.12); *H01L 31/0735* (2013.01); *B82Y 20/00* (2013.01); *Y02E 10/52* (2013.01); *Y02E 10/544* (2013.01); *Y10S 977/774* (2013.01); *Y10S 977/948* (2013.01)

(58) Field of Classification Search
CPC .................................................. H01L 31/0543
See application file for complete search history.

(56) References Cited

U.S. PATENT DOCUMENTS

| | | | | |
|---|---|---|---|---|
| 2010/0084924 | A1* | 4/2010 | Frolov | H01L 31/02021 307/82 |
| 2011/0155061 | A1* | 6/2011 | Chen | C23C 16/301 118/725 |
| 2012/0085400 | A1* | 4/2012 | Arena | H01L 31/04 136/255 |
| 2013/0240348 | A1* | 9/2013 | Mi | H01L 31/03044 204/157.5 |

(Continued)

OTHER PUBLICATIONS

Shane Callanan, "Driving LEDs", Jun. 13, 2011, Empowering Global Innovation, pp. 1-5.*

(Continued)

*Primary Examiner* — Devina Pillay
*Assistant Examiner* — Daniel P Malley, Jr.
(74) *Attorney, Agent, or Firm* — Perry + Currier Inc.

(57) ABSTRACT

Solar cells that include quantum dots are provided. In particular, a solar panel is provided, the solar panel comprising: a first solar cell comprising: a first set of quantum dots in a first semiconductor, the first semiconductor configured to receive one or more of ambient light and sunlight and emit first wavelengths a first range of about 450 nm to about 480 nm, the first set of quantum dots configured to convert the first wavelengths to a first electric output; and, a second solar cell comprising: a second set of quantum dots in a second semiconductor, the second semiconductor configured to receive one or more of the ambient light and the sunlight and emit second wavelengths a second range of about 600 nm to about 700 nm, the second set of quantum dots configured to convert the second wavelengths to a second electric output.

18 Claims, 11 Drawing Sheets

(56) References Cited

U.S. PATENT DOCUMENTS

| | | | | |
|---|---|---|---|---|
| 2013/0240829 A1* | 9/2013 | Kuramachi | ....... | H01L 21/02458 257/9 |
| 2015/0214402 A1* | 7/2015 | Yoshikawa | ..... | H01L 31/035218 136/262 |

OTHER PUBLICATIONS

Wu "Applied Physics Reviews—Focused Review: When group-III nitrides go infrared: New properties and perspectives" Journal of Applied Physics vol. 106, No. 1, 011101 2009 pp. 011101-1 to 011101-28.

Van Sark et al. "Upconversion in solar cells" Nanoscale Research Letters 2013, 8:81 pp. 1-10 http://www.nanoscalereslett.com/content/8/1/81.

Trybus "Molecular Beam Epitaxy Growth of Indium Nitride and Indium Gallium Nitride Materials for Photovoltaic Applications A Ph.D. Dissertation Presented to the Academic Faculty" Georgia Institute of Technology May 2009 pp. i-156.

Smeeton et al. "Self-assembled InGaN Quantum Dots Grown by Molecular Beam Epitaxy" Feb. 2007 pp. 86-91.

Marti et al. "Potential of Mn doped In1-xGaxN for implementing intermediate band solar cells" Elsevier Solar Energy Materials & Solar Cells 93 (2009) 641-644 www.elsevier.com/locate/solmat.

Labelle et al. "Colloidal Quantum Dot Solar Cells Exploiting Hierarchical Structuring" American Chemical Society Publications DOI: 10.1021/nl504086v Nano Lett. 2015, 15, 1101-1108.

Gorji et al. "The effects of recombination lifetime on efficiency and J-V characteristics of InxGa1xN/GaN quantum dot intermediate band solar cell" Elsevier Physica E 42 (2010) pp. 2353-2357 www.elsevier.com/locate/physe.

Deng et al. "Theoretical study on InxGa1-xN/GaN quantum dots solar cell" Elsevier Physica B 406 (2011) pp. 73-76 www.elsevier.com/locate/physb.

Brongersma et al. "Light management for photovoltaics using high-index nanostructures" Nature Materials Published Online: Apr. 22, 2014 DOI: 10.1038/NMAT3921.

Alghamedi et al. "Spectrally-selective all-inorganic scattering luminophores for solar energy-harvesting clear glass windows" Scientific Reports 2014, 4 : 6632 | DOI: 10.1038/srep06632, pp. 1-9.

Canada Led Light/LED Technology Nov. 24, 2013.

Fuller et al Observation of Coherence in Photosystem II Reaction Center Oct. 3, 2013.

Fuller et al_Vibronic coherence in oxygenic photosynthesis (nchem 2014) Jul. 13, 2014.

Harima _Props GaN & related by Raman (JPhysCondensMat 14,2002) R967} Sep. 12, 2002.

Harima(2002) Props GaN & related by Raman {JPhysCondensMat 14} Sep. 12, 2002.

Huelga_Vibrations, quanta & biology 2013 Nov. 15, 2013.

Halpin_2D Spec of Molecular Excitons 2014 Apr. 17, 2015.

kim_phonon tuning and recycling in photonic energy conversion 2011 Jun. 10, 2011.

Senlik_Two-Color Nonlinear Spectroscopy for Rapid Acquisition of Coherent Dynamics (jpclett 2015,6) Jun. 5, 2015.

Wellbum_The Spectral Determination of Chlorophylls a and b as well as Total Carotenoids Using Various Solvents-with Spectrophotometers of Different Resolution (1994) Mar. 8, 1994.

* cited by examiner

SOLAR CELLS THAT INCLUDE QUANTUM DOTS

FIELD

The specification relates generally to solar cells, and specifically to solar cells that include quantum dots.

BACKGROUND

Traditional solar cells are generally designed to function only in daylight and generally absorb light in human visible spectrums, converting the light to electrical energy using semiconductors. However, such solar cells are generally inefficient, typically in the 25-20% range, and furthermore do not function beyond daylight hours.

SUMMARY

In general, this disclosure is directed to solar cells that include quantum dots in semiconductors that function at the edges of the human visible light range. A first solar cell includes a first set of quantum dots in a first semiconductor, the first semiconductor configured to receive one or more of ambient light and sunlight and emit wavelengths in a near blue range, for example about 450 nm to about 480 nm; the first set of quantum dots are configured to convert these wavelengths to an electrical output. In particular, the first semiconductor can be configured to convert light in the ultraviolet and/or near ultraviolet to the near blue, the ultraviolet and/or near ultraviolet also present at night, for example in starlight, and the like. Hence, the first set of quantum dots receives light in the near blue both in the daytime (e.g. from both the first semiconductor and one or more of ambient light and sunlight) and in the nighttime. Similarly, a second solar cell includes a second set of quantum dots in a second semiconductor, the second semiconductor configured to receive one or more of ambient light and sunlight and emit wavelengths in a red range, close to infrared, for example about 600 nm to about 700 nm; the second set of quantum dots are configured to convert these wavelengths to an electrical output. In particular, the second semiconductor can be configured to convert light in the infrared and/or near infrared to the wavelengths in a red range, the infrared and/or near infrared also present at night, for example in starlight. Hence, the second set of quantum dots receives light in the red both in the daytime (e.g. from both the second semiconductor and one or more of the ambient light and the sunlight) and in the nighttime. Thus, the solar cell functions both in the daytime and in the nighttime. Furthermore, as the solar cell converts light in both a near blue range (e.g. close to the ultraviolet) and a red range (e.g. close to the infrared) to energy, the solar cell generally can mimic the natural process of photosynthesis in an artificial way to convert one or more of ambient light and sunlight into energy. Hence, the solar cell can also comprise a biomimicry device.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, ZZ, and the like). Similar logic can be applied for two or more items in any occurrence of "at least one . . . " and "one or more . . . " language.

An aspect of the present specification provides a solar panel comprising: a first solar cell comprising: a first set of quantum dots in a first semiconductor, the first semiconductor configured to receive one or more of ambient light and sunlight and emit first wavelengths a first range of about 450 nm to about 480 nm, the first set of quantum dots configured to convert the first wavelengths to a first electric output; and, a second solar cell comprising: a second set of quantum dots in a second semiconductor, the second semiconductor configured to receive one or more of the ambient light and the sunlight and emit second wavelengths a second range of about 600 nm to about 700 nm, the second set of quantum dots configured to convert the second wavelengths to a second electric output.

The first wavelengths can define a spectrum centered in the first range, and the second wavelengths can define a respective spectrum centered in the second range.

The first semiconductor can be further configured to convert one or more of ultraviolet (UV) light and near-ultraviolet (NVR) light in one or more of the ambient light and the sunlight to the first wavelengths.

The second semiconductor can be further configured to convert one or more of infrared (IR) light and near-IR (NIR) light in one or more of the ambient light and the sunlight to the second wavelengths.

The solar panel can further comprise one or more electrical connectors to the first set of quantum dots and the second set of quantum dots, the one or more electrical connectors configured to: convey the first electric output out of the first solar cell; and convey the second electric output out of the second solar cell.

The solar panel can further comprise a substrate, the first solar cell and the second solar cell being side-by-side on the substrate.

The solar panel can further comprise: a substrate; a plurality of first solar cells, including the first solar cell, each of the plurality of first solar cells similar to the first solar cell; and, a plurality of second solar cells, including the second solar cell, each of the plurality of second solar cells similar to the second solar cell, the plurality of first solar cells and the plurality of second solar cells arranged on the substrate.

The solar panel can further comprise a substrate, the second solar cell located on the substrate, and the first solar cell located on the second solar cell, the first solar cell being transparent to the second wavelengths.

The solar panel can further comprise a substrate, the first solar cell located on the substrate, and the second solar cell located on the first solar cell, the second solar cell being transparent to the first wavelengths.

The first solar cell and the second solar cell can be stacked on each other and on a substrate, an outer solar cell, of the first solar cell and the second solar cell, can be transparent to respective wavelengths associated with an inner solar cell, of the first solar cell and the second solar cell. The substrate can be transparent and the inner solar cell can be transparent to respective associated wavelengths of the outer solar cell.

The first semiconductor can comprise one or more of: GaN, InGaN, and AlGaN, and the second semiconductor can comprise one or more of: InGaN, AlInGaN, and InGaAlP.

The first set of quantum dots can be doped with one or more of: Si, Ge, Cr, S, Fe, Mn, Zn, and the second set of quantum dots can be doped with one or more of Mg, Be, Ba, Cr, Al, Fe.

The first set of quantum dots can be doped with an N-type material with absorption in the first range, and the second set of quantum dots can be doped with a P-type material with absorption in the second range.

The first semiconductor can comprise $In_xGa_{(1-x)}N$, where x can be in a range of about 0.0 to about 0.10.

The second semiconductor can comprise $In_xGa_{(1-x)}N$, where x can be in a range of about 0.60 In to about 0.75.

The second semiconductor can comprise materials configured to convert infrared light to the second wavelengths in the second range.

The solar panel can further comprise one or more lenses configured to convey one or more of the ambient light and the sunlight into the first solar cell and the second solar cell.

The solar panel of claim 1, wherein one or more of the first semiconductor and the second semiconductor can be in a shape of one or more lenses configured to convey the one or more of the ambient light and sunlight into a respective solar cell.

The solar panel can further comprise one or more reflective layers arranged to reflect one or more of the ambient light and the sunlight passing through one or more of the first solar cell and the second solar cell back through one or more one or more of the first solar cell and the second solar cell.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
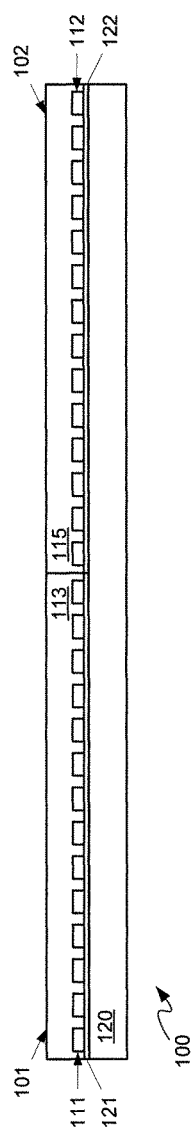
FIG. 1 depicts a solar panel that includes quantum dots in semiconductors, according to non-limiting implementations.

FIG. 1 depicts a solar panel 100 comprising: a first solar cell 101 comprising: a first set of quantum dots 111 in a first semiconductor 113, first semiconductor 113 configured to receive one or more of ambient light and sunlight and emit first wavelengths a first range of about 450 nm to about 480 nm, first set of quantum dots 111 configured to convert the first wavelengths to a first electric output; and, a second solar cell 102 comprising: a second set of quantum dots 112 in a second semiconductor 115, second semiconductor 115 configured to receive one or more of the ambient light and the sunlight and emit second wavelengths a second range of about 600 nm to about 700 nm, second set of quantum dots 112 configured to convert the second wavelengths to a second electric output. In particular FIG. 1 depicts a cross-sectional view of solar panel 100; hence while only one row of quantum dots 111 and one row of quantum dots 112 are depicted, each set of quantum dots 111, 112 can be arranged in a two-dimensional array, and/or in a regular two-dimensional structure and/or in a random two-dimensional structure in solar panel 100. In some implementations, the second range can comprise about 630 nm to about 700 nm; in other implementations, the second range can comprise about 630 nm to about 690 nm; in yet further implementations, the second range can comprise about 630 nm to about 680 nm.

Additionally, a depicted shape of quantum dots 111, 112 is merely meant to be schematic, and quantum dots 111, 112 can be in suitable shape, for example, as circles, rectangles, mesas, and the like.

Furthermore, in some implementations, one or more of first solar cell 101 and second solar cell 102 can comprise a stack of respective semiconductors and respective quantum dots. For example, while as depicted first solar cell 101 comprises one layer of first semiconductor 113 and one set of quantum dots 111, in other implementations, the semiconductor 113/quantum dots 111 structure can be repeated to increase the overall efficiency of first solar cell 101. Alternatively, first solar cell 101 can comprise a layer of first semiconductor 113 and stacks of layers of quantum dots. Similar structures can be present in second solar cell 102, using second semiconductor 115 and quantum dots 112.

As depicted in FIG. 1, solar panel 100 further comprises a substrate 120 which can be transparent and/or partially transparent to sunlight, ambient light, and starlight (or other sources of light present at night) and the like, opaque or translucent. When transparent (and/or partially transparent and/or translucent), sunlight, ambient light and light from radiative sources present at night (such as starlight, skyglow, moonlight, etc.) can generally be received from both sides of solar panel 100. For example, substrate 120 can comprise one or more of silicon, glass, plastic, metal and the like. Other types of substrate materials for solar cells are within the scope of present implementations and will occur to persons of skill in the art.

As also depicted in FIG. 1, solar panel 100 can further comprise one or more electrical connectors 121, 122 to first set of quantum dots 111 and second set of quantum dots 112, one or more electrical connectors 121, 122 configured to: convey the first electric output out of first solar cell 101; and convey the second electric output out of the second solar cell 102. For example, electrical connector 121 is in connector with first set of quantum dots 111 and electrical connector 122 is in connector with second set of quantum dots 112. Alternatively, solar panel 100 can include one electrical connector that connects to both sets of quantum dots 111, 112, or a plurality of electrical connectors that connect to subsets of quantum dots 111, 112. As depicted, one or more electrical connectors 121, 122 comprise a thin film layer between each of solar cells 101, 102 and substrate 120. For example, electrical connectors 121, 122 can comprise a conducting metallic layer such as aluminum, gold, platinum, and the like. In addition, electrical connectors 121, 122 can comprise a transparent and/or partially transparent material including, but not limited to, indium tin oxide (ITO) and the like; for example, when substrate is transparent and/or partially transparent, electrical connectors 121, 122 can also be transparent and/or partially transparent. Furthermore, electrical connectors 121, 122 can be located at other positions in solar panel 100 that convey electrical output out of solar cells 101, 102, as will occur to persons of skill in the art.

Operation of first solar cell 101 in daylight is now described with reference to FIG. 2, which depicts first solar cell 101 independent of second solar cell 102. In particular, in FIG. 1, first solar cell 101 and second solar cell 102 are side-by-side and/or adjacent on substrate 120, however in FIG. 2, first solar cell 101 is depicted without second solar cell 102, but solar cell 102 is nonetheless appreciated to be present in FIG. 2.

Figure 2:
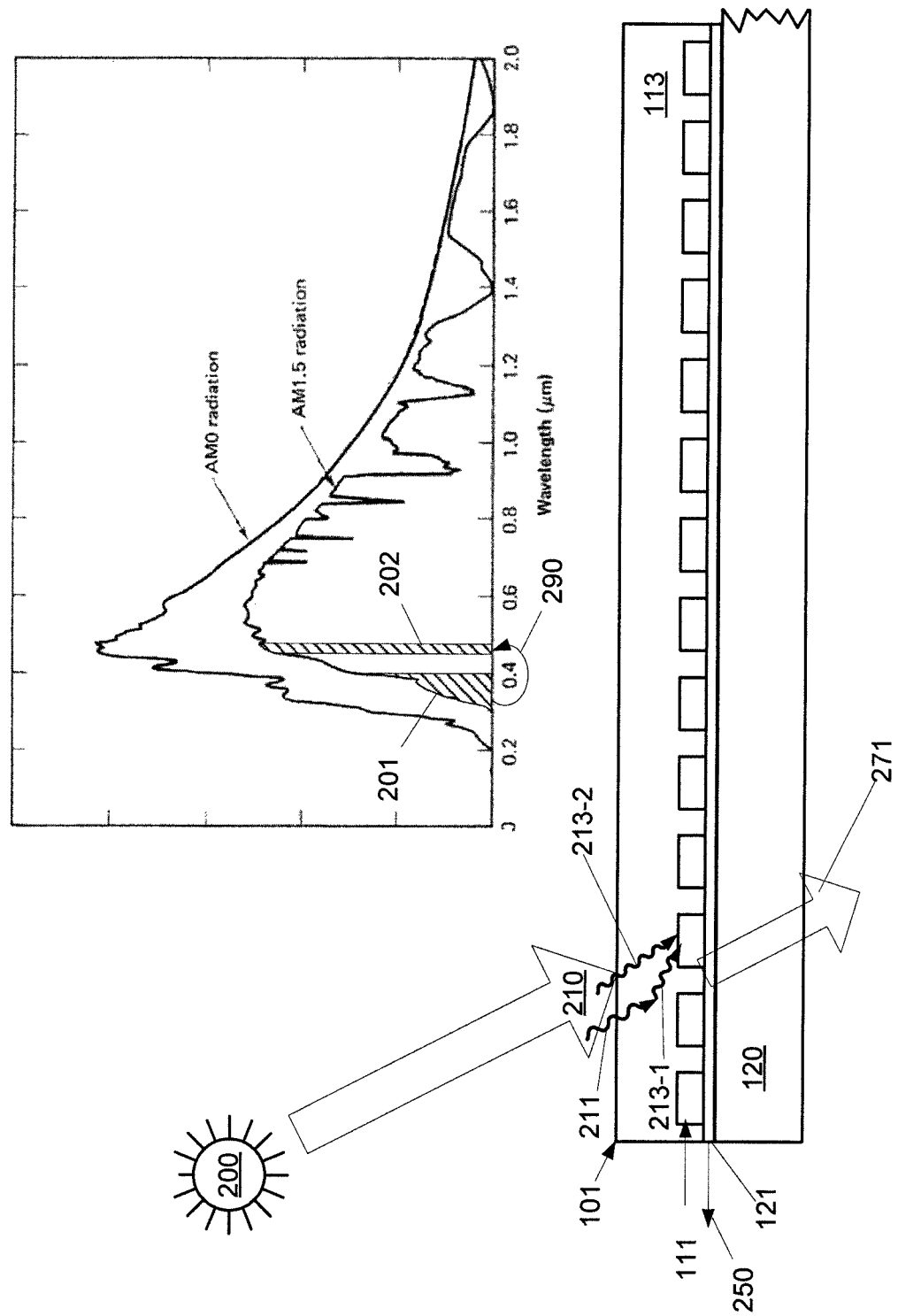
FIG. 2 depicts operation of a portion of the solar panel of FIG. 1, according to non-limiting implementations.

Also depicted in FIG. 2 is the sun 200 and a graph of radiation from the sun 200 as a function of wavelength, including a curve of standard air-mass zero ("AM0") radiation from the sun 200, and a curve of air-mass 1.5 atmosphere ("AM1.5"), each in relative units, with AM1.5 generally being used as the standard within the solar panel industry. Furthermore, a range 201 of about 300 nm to about 400 nm (which can also be referred to as a near-ultra-violet ("NUV") range) is indicated under the AM1.5 curve, as well as a range 202 of about 450 nm to about 480 nm (which can also be referred to as a near-blue range). In addition, while the following figures are discussed with respect to light emitted from the sun 200, it is appreciated that light conversion as described herein can occur for any form of ambient light to which solar panel 100 is exposed.

In general, semiconductor 113 is selected such that at least a portion of light 211 (e.g. with wavelengths in range 201) of sunlight 210 that irradiates semiconductor 113 is converted to light 213-1 of wavelengths in range 202. Not all of sunlight 210 is necessarily converted to light 213-2; for example, semiconductor 113 can be selected such that the wavelengths converted by semiconductor 113 to light 213-1 define a spectrum centered in first range 201, for example, a Gaussian-shaped spectrum and the like. Indeed, semiconductor 113 can be sensitive to wavelengths outside of first range 201, but with a conversion spectrum centred (and/or near-centered) in first range 201.

For example, semiconductor 113 can comprise a semiconductor system where a bandgap and/or intermediate levels are selected and/or adjusted by way of materials selection and/or doping and/or selection of materials for quantum dots 111 such that light in range 201 is converted to light 213-1 in range 202; as such, electrons in semiconductor 113 are excited by light 213-1 in range 201 (e.g. from sunlight 210) and, excited electrons can relax to an intermediate level in where light 213-1 in range 202 is emitted. Furthermore, a size, spacing and the like of quantum dots 111 can also affect the bandgap and/or intermediate levels of semiconductor 113. Hence, semiconductor 113 and quantum dots 111 together comprise a wavelength and/or energy conversion system that converts light in the ultraviolet and/or near ultraviolet range to light in the near-blue range. However, in other implementations, semiconductor 113 can be configured to convert other wavelength ranges to the near-blue range, including light in ranges lower than range 201, and light in ranges higher than range 201 (including light in ranges higher than range 202).

As depicted, materials and/or size of first set of quantum dots 111 are selected to convert at least a portion of light 213-1 in range 202 to produce an electrical output 250, which can be extracted from first solar cell 101 via electrical connector 121, as well to select the bandgap and/or intermediate levels of semiconductor 113. It is noted that light in range 202 is received at first set of quantum dots 111 both from light 213-1 emitted by semiconductor 113 during the conversion process and from light 213-2 in range 202 in sunlight 210. Light 213-1, 213-2 in range 202 will hence interchangeably be referred to hereafter as light 213.

As a size and/or materials of first set of quantum dots 111 are selected to convert light 213 in range 202 to electrical output 250, and as quantum dots can, in general, be precisely tuned, the overall efficiency of the conversion rate of light 213 in range 202 can be increased by converting light 211 in range 201 to light 213 in range 202 by semiconductor 113, as also indicated by arrow 290. Furthermore, as there is background ambient ultraviolet radiation at night (for example from skyglow, light pollution, zodiacal light, starlight, etc.) first solar cell 101 will also generate electrical output at night.

A remainder 271 of sunlight 210 can pass through semiconductor 113 and quantum dots 111, presuming that semiconductor 113 and quantum dots 111 are transparent to wavelengths of light outside of ranges 201, 202. In other words, remainder 271 can comprise wavelengths of sunlight 210 with at least a portion of light 211, 213 in wavelength ranges 201, 202 absorbed by semiconductor 113 and/or quantum dots 111.

The conversion process is described in further detail with reference to FIG. 3, which depicts semiconductor 113 having a bandgap 301, with an intermediate level 302, as well as a quantum dot 111 having an associated bandgap 303; furthermore, while only one quantum dot 111 is depicted, it is appreciated that first set of quantum dots 111 is present and that a size of bandgap 301 and/or a position of intermediate level 302 can at least partially arise from, and/or be influence by, a size & spacing of a plurality of quantum dots 111. Bandgap 301 is selected such that electrons of semiconductor 113 are excited across bandgap 301 by light 211; electrons are not labelled in FIG. 3, but are depicted as shaded circles. Electrons excited across bandgap 301 then relax to intermediate level 302, such that light 213-1 is emitted by semiconductor 113. While not depicted, electrons can then relax to the bottom of bandgap 301. Light 213-1 emitted by semiconductor 113 interacts with electrons in quantum dot 111, and bandgap 303 is selected such that electrons of quantum dot 111 are excited across bandgap 303 by light 213-1 (and/or by light 213-2 from sunlight, and the like); indeed, bandgap 303 is selected such that electrons are excited out of quantum dot 111 thereby generating electrical output 250. Similarly, intermediate level 302 is selected to produce light 213-1 compatible with bandgap 303. A similar process occurs during the nighttime due to UV radiation present at night from sources described above.

Operation of second solar cell 102 in daylight is now described with reference to FIG. 4, which depicts second solar cell 102 independent of second solar cell 101. In particular, in FIG. 1, first solar cell 101 and second solar cell 102 are side-by-side and/or adjacent on substrate 120, however in FIG. 4, second solar cell 102 is depicted without first solar cell 101, but first solar cell 101 is nonetheless appreciated to be present in FIG. 4.

Figure 4:
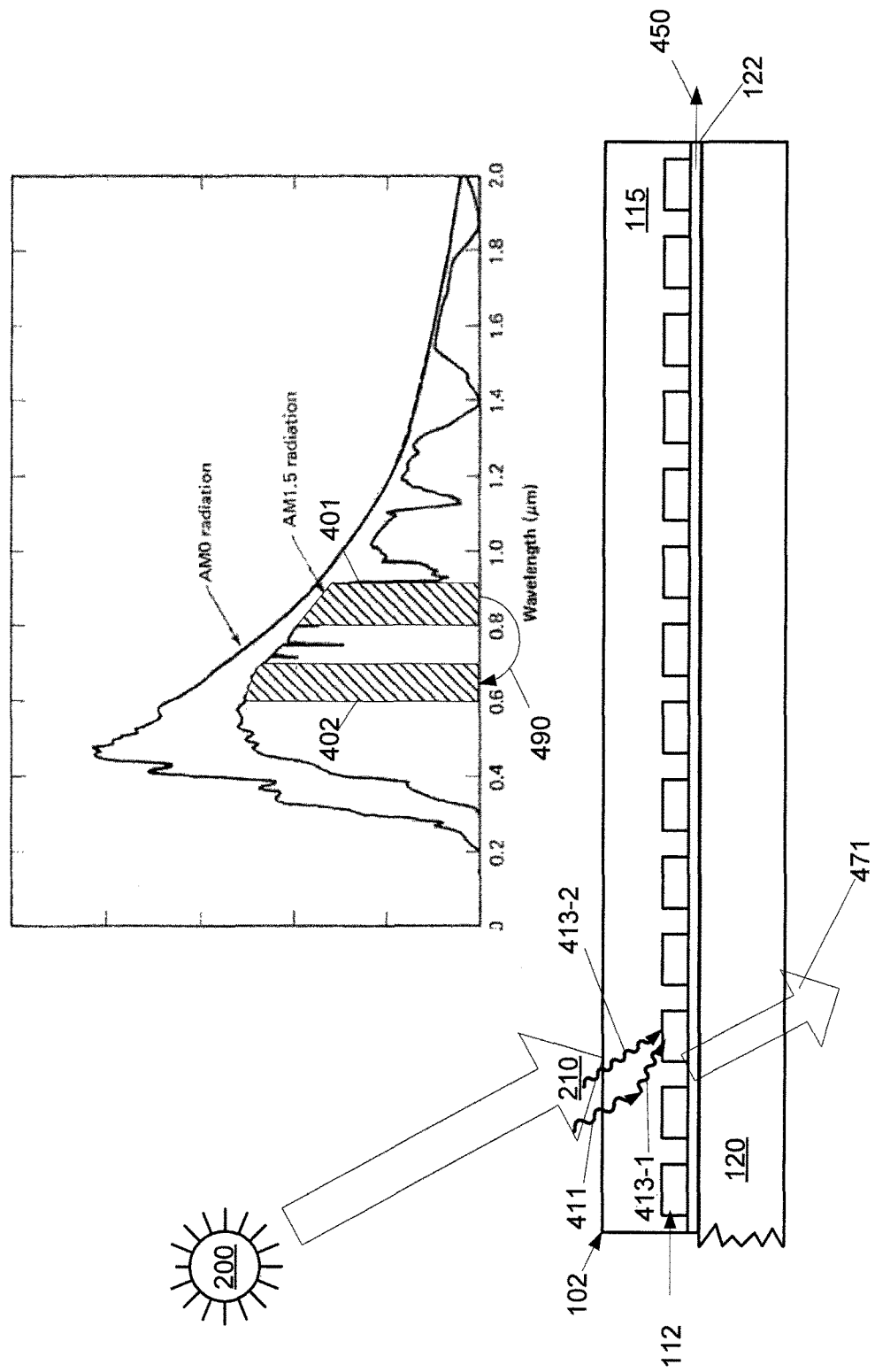
FIG. 4 depicts operation of another portion of the solar panel of FIG. 1, according to non-limiting implementations.

Also depicted in FIG. 4 are the sun 200 and the graph of radiation from the sun 200 as depicted in FIG. 2. Furthermore, a range 401 of about 800 nm to about 900 nm (which can also be referred to as a near-infrared ("NIR") range) is indicated under the AM1.5 curve, as well as a range 402 of about 600 nm to about 700 nm. However, in other implementations, range 402 can comprise about 630 nm to about 700 nm; in further implementations, range 402 can comprise about 630 nm to about 690 nm; in yet further implementations, range 402 can comprise about 630 nm to about 680 nm.

In general, semiconductor 115 is selected such that at least a portion of light 411 (e.g. with wavelengths in range 401) of sunlight 210 that irradiates semiconductor 115 is converted to light 413-1 of wavelengths in range 402. Not all of sunlight 210 is necessarily converted to light 413-2; for example, semiconductor 115 can be selected such that the wavelengths converted by semiconductor 115 to light 413-2 define a spectrum centered in first range 401, for example, a Gaussian-shaped spectrum and the like. Indeed, semiconductor 115 can be sensitive to wavelengths outside of first range 401, but with a conversion spectrum centred (and/or near-centered) in first range 401.

For example, semiconductor 115 can comprise a semiconductor system where a bandgap and/or intermediate levels are selected and/or adjusted by way of materials selection and/or doping and/or selection of materials for quantum dots 112 such that light in range 401 is converted to light 411 in range 402; as such, electrons in semiconductor 115 are excited by light in range 401 (e.g. from sunlight 210, and the like) and, excited electrons can relax to an intermediate level in where light 411 in range 402 is emitted. Furthermore, a size, spacing and the like of quantum dots 112 can also affect the bandgap and/or intermediate levels of semiconductor 115. Hence, semiconductor 115 and quantum dots 112 together comprise a wavelength and/or energy conversion system that converts light in the infrared and/or near infrared range to light in the red range. Such down conversion of wavelengths of light (and/or up conversion of energy) can occur when two or more low-energy (e.g. sub-bandgap) photons are combined into a higher energy photon. However, in other implementations, semiconductor 115 can be configured to convert other wavelength ranges to the red range, including light in ranges higher than range 401, and light in ranges lower than range 401 (including light in ranges lower than range 402).

As depicted, materials and/or size of second set of quantum dots 112 are selected to convert at least a portion of light 413-1 in range 402 to produce an electrical output 450, which can be extracted from second solar cell 102 via electrical connector 122. It is noted that light in range 402 is received at second set of quantum dots 112 both from light 413-2 in range 402 in sunlight 210 and light 413-1 emitted by semiconductor 115 during the conversion process. Light 413-1, 413-2 in range 402 will hence interchangeably be referred to hereafter as light 413.

As a size and/or materials of second set of quantum dots 112 are selected to convert light 413 in range 402 to electrical output 450, and as quantum dots can, in general, be precisely tuned, the overall efficiency of the conversion rate of light 413 in range 402 can be increased by converting light 411 in range 401 to light 413 in range 402 by semiconductor 115, as also indicated by arrow 490. Furthermore, as there is background ambient infrared radiation at night (for example from skyglow, light pollution, zodiacal light, starlight, etc.) second solar cell 102 will also generate electrical output at night.

A remainder 471 of sunlight 210 can pass through semiconductor 115 and quantum dots 112, presuming that semiconductor 115 and quantum dots 112 is transparent to wavelengths of light outside of ranges 401, 402. In other words, remainder 471 can comprise wavelengths of sunlight 210 with at least a portion of light in wavelength ranges 401, 402 absorbed by semiconductor 115 and/or quantum dots 112.

The conversion process is described in further detail with reference to FIG. 5, which depicts semiconductor 115 having a bandgap 501, with an intermediate level 502, as well as a quantum dot 112 having an associated bandgap 503; furthermore, while only one quantum dot 112 is depicted, it is appreciated that second set of quantum dots 112 is present and that a size of bandgap 401 and/or a position of intermediate levels 502 (and an intermediate level 505, described below) can at least partially arise from, and/or be influence by, a size & spacing of a plurality of quantum dots 112. Bandgap 501 is selected such that electrons of semiconductor 113 are excited across bandgap 501 by light 211; electrons are not labelled in FIG. 5, but are depicted as shaded circles. For example, electrons can absorb two photons of light 411, a first photon at a bottom of bandgap 501 where the electron is excited to another intermediate level 505, and a second photon the another intermediate level 505. While the process as described herein is simplified for clarity, such a process can be referred to as down conversion of light (and/or up conversion of energy) and occur when two or more low-energy (e.g. sub-bandgap) photons are combined into a higher energy photon.

For example, electrons excited across bandgap 501 then relax to intermediate level 502, such that light 413-1 is emitted by semiconductor 113. While not depicted, electrons can then relax to the bottom of bandgap 501. Light 413-1 emitted by semiconductor 113 interacts with electrons in quantum dot 112, and bandgap 503 is selected such that electrons of quantum dot 112 are excited across bandgap 503 by light 413-1 (and/or by light 413-2 from sunlight, and the like); indeed, bandgap 503 is selected such that electrons are excited out of quantum dot 112 thereby generating electrical output 450. Similarly, intermediate level 502 is selected to produce light 413-1 compatible with bandgap 503. A similar process occurs during the nighttime due to infrared radiation present at night from sources described above.

In particular, it is known that the night sky is a relatively large source of infrared radiation at least in the near infrared red range. Hence, at least solar cell 102 will operate at night, as well as in daytime, as light 411 in range 401 is converted to light 413-1 by semiconductor 115, which is in turn converted to electrical output 450 by quantum dots 112.

Hence, returning to FIG. 1, solar panel 100 comprises first solar cell 101 and second solar cell 102 arranged side-by-side on substrate 120. Furthermore, as described with reference to FIG. 2, first semiconductor 113 can be further configured to convert one or more of ultraviolet (UV) light and near-ultra-violet (NVR) light in sunlight, and the like, to first wavelengths in a first range 201, and, as described with reference to FIG. 3, second semiconductor 115 is further configured to convert one or more of infrared (IR) light and near-IR (NIR) light in the sunlight, and the like, to the second wavelengths in a second range 402. Hence, solar panel 100 generally operates in four wavelength ranges: the ultraviolet (and/or NUV), the near-blue, the red, and the infrared (and/or NIR); furthermore light in the ultraviolet (and/or NUV) and the infrared (and/or NIR) is converted to respective light near the opposite edges of the visible spectrum (e.g. in the human visual system ("HVS")), where it is converted to an electrical output.

Indeed, solar panel 100 generally converts energy in the ultraviolet (and/or NUV) to the near-blue, and energy in the infrared (and/or NIR) to the red. Put another way, charge transfer occurs from semiconductor 113 to quantum dots 111 when semiconductor 113 is excited by sunlight and/or ambient light, and charge transfer occurs from semiconductor 115 to quantum dots 112 when semiconductor 115 is excited by sunlight and/or ambient light. Indeed, such charge transfer can occur by mechanisms other than each of semiconductors 113, 115 emitting respective light; rather, each of semiconductors 113, 115 can emit charge which is collected by respective quantum dots 111, 112 and/or quanta of energy emitted by each of semiconductors 113, 115 can be used to excite respective quantum dots 111, 112.

Furthermore, as solar panel 100 can convert light in the near-blue and red wavelength ranges to energy other than light energy (e.g. a respective electrical output), solar panel 100 can also be viewed as a system that mimics photosynthesis, exploiting similar wavelength ranges as, for example, chlorophyll A, and the like. Hence, solar panel 100 can also comprise a biomimicry system that mimics, at least in part, the energy conversion processes of photosynthesis in leaves, for example.

Solar panel 100 can further comprise various materials systems to achieve the desired energy conversion. For example, in some implementations, first semiconductor 113 can include, but is not limited to, one or more of: GaN, InGaN, AlGaN and the like; and second semiconductor 115 can include, but is not limited to, one or more of: InGaN, AlInGaN, InGaAlP, and the like. In each of semiconductors 113, 115, ratios and/or compositions of materials are selected according to the desired respective bandgap, as will occur to persons of skill in the art.

Furthermore, first set of quantum dots 111 can be doped with an n-type material with absorption in second range 202, including, but not limited to, one or more of Si, Ge, Cr, S, Fe, Mn, Zn and the like; and second set of quantum dots 112 can be doped with a p-type material with absorption in second range 402, including, but not limited to, one or more of Mg, Be, Ba, Cr, Al, Fe and the like.

In particular non-limiting implementations, first semiconductor 113 can comprise $In_xGa_{(1-x)}N$, where x in a range of about 0.0 to about 0.10 (e.g. when x=0, semiconductor 113 comprises GaN), as well as one or more appropriate dopants, such as Si. In further particular non-limiting implementations, second semiconductor 115 comprises $In_xGa_{(1-x)}N$, where x in a range of about 0.60 In to about 0.75. In general, in each of these implementations, each semiconductor 113, 115 can be doped with one or more materials that adjusts respective bandgaps, and/or introduces intermediate levels, that enable operation to each semiconductor 113, 115 as described above.

Figure 5:
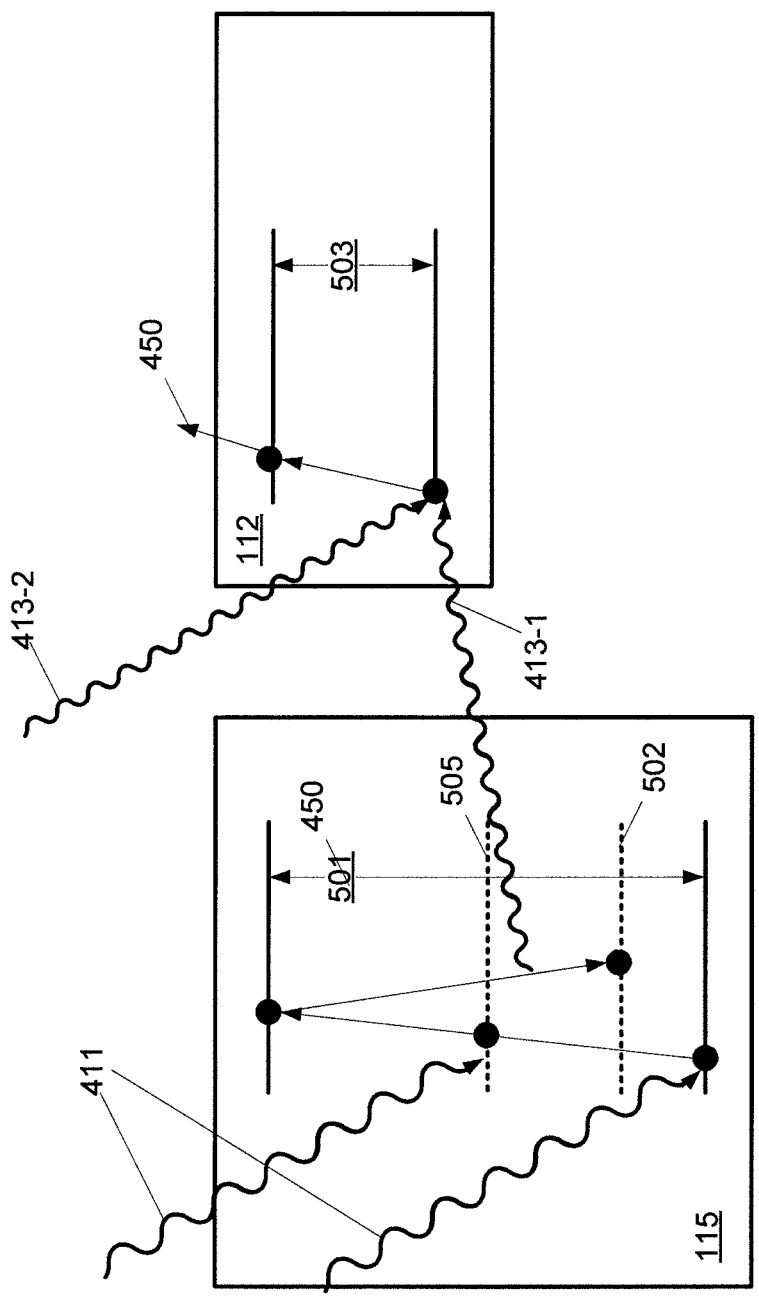
FIG. 5 depicts further details of the operation of the portion of FIG. 3, according to non-limiting implementations.

However, for the above described conversion from infrared to red light with respect to FIG. 5, second semiconductor 115 can comprise various "upconverter" materials and/or systems including, but not limited to, $NaYF_4$:(Er,Yb), $BaCl_2$:($Er^{3+}$,$Dy^{3+}$), and the like. Indeed, any material which can convert infrared and/or near infrared light to red light is within the scope of present implementations.

Figure 3:
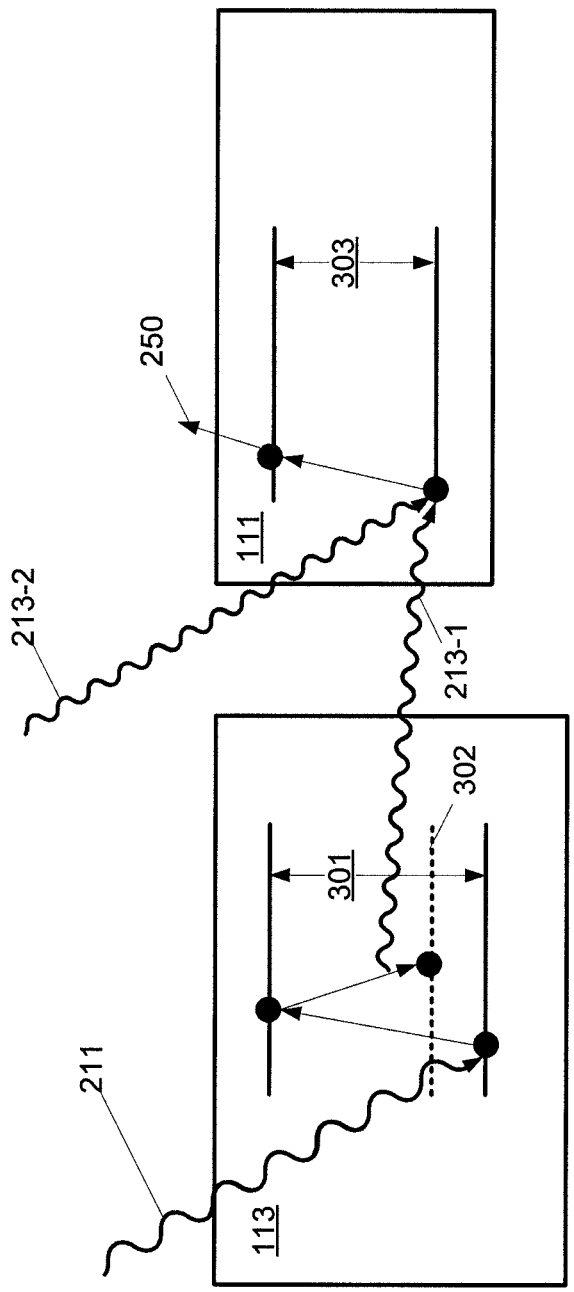
FIG. 3 depicts further details of the operation of the portion of FIG. 2, according to non-limiting implementations.

Similarly, for the above described conversion from ultraviolet to blue light with respect to FIG. 3, first semiconductor 113 can comprise various "downconverter" materials and/or systems. Indeed, any material which can convert ultraviolet and/or near ultraviolet light to blue light is within the scope of present implementations.

Similarly, one or more of a size and material of each set of quantum dots 111, 112 are selected such that each set of quantum dots 111, 112 converts light in a respective range to an electrical output.

In FIG. 1, first solar cell 101 and second solar cell 102 are adjacent one another on substrate 120; for example, each of solar cells 101, 102 can occupy about half of an area of substrate. However, other implementations are within the scope of present implementations.

Figure 6:
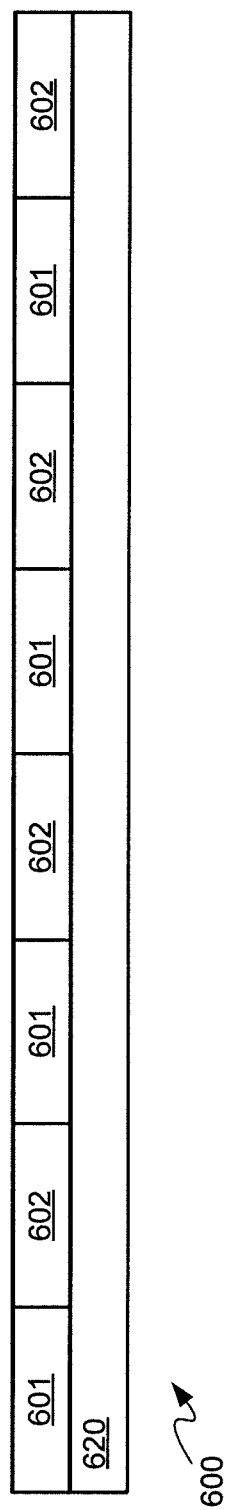
FIG. 6 depicts a solar panel that includes quantum dots in semiconductors, according to alternative non-limiting implementations.

For example, attention is next directed to FIG. 6 which depicts a solar panel 600 that is substantially similar to solar panel 100, with like elements having like numbers, however in a "600" series rather than a "100" series. In particular, solar panel 600 comprises a substrate 620; a plurality of first solar cells 601 (which can include first solar cell 101), each of plurality of first solar cells 601 similar to first solar cell 101; a plurality of second solar cells 602 (which can include second solar cell 602), each of plurality of second solar cells 602 similar to second solar cell 102, plurality of first solar cells 601 and plurality of second solar cells 602 arranged on substrate 620. While not depicted in FIG. 6, it is assumed that each of plurality of first solar cells 601 comprises a set of quantum dots and a semiconductor similar, respectively, to first set of quantum dots 111 and semiconductor 113, and that each of plurality of second solar cells 602 comprises a set of quantum dots and a semiconductor similar, respectively, to second set of quantum dots 112 and semiconductor 115. It is further assumed that solar panel 600 comprises one or more electrical connectors similar to one or more of electrical connectors 121, 122.

As depicted, solar cells 601 alternate with solar cells 602, however solar cells 601, 602 can be arranged in any suitable pattern on substrate 620.

Persons skilled in the art will appreciate that there are yet more alternative implementations and modifications possible, and that the above examples are only illustrations of one or more implementations.

Figure 7:
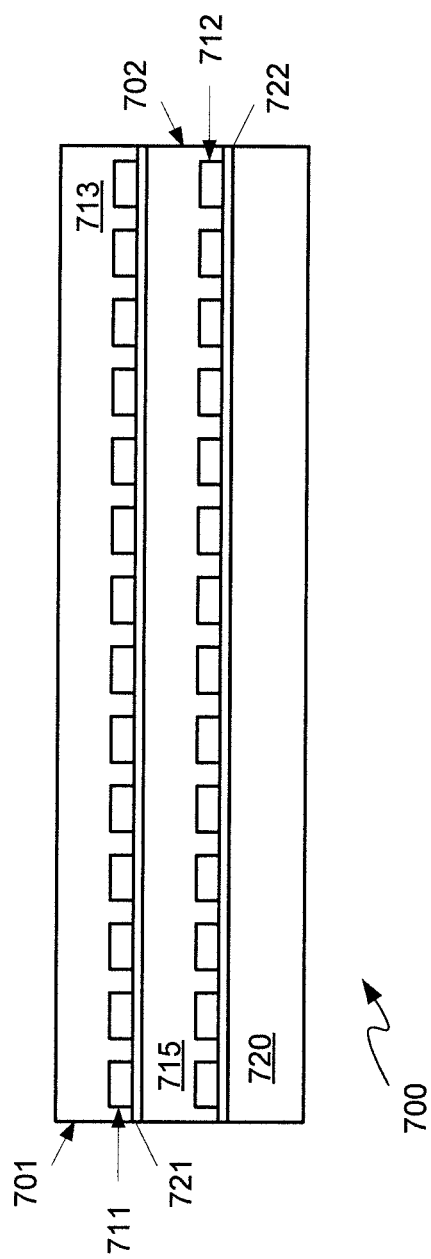
FIG. 7 depicts a solar panel that includes quantum dots in semiconductors and stacked solar cells, according to alternative non-limiting implementations.

For example, attention is next directed to FIG. 7, which depicts a solar panel 700 that is substantially similar to solar panel 100, with like elements having like numbers, however in a "700" series rather than a "100" series. In particular, solar panel 700 comprises a substrate 720, a first solar cell 701 and a second solar cell 702. As also depicted in FIG. 7, first solar cell 701 comprises a respective set of quantum dots 711 and a respective semiconductor 713, similar, respectively, to first set of quantum dots 111 and semiconductor 113; and second solar cell 702 comprises a respective set of quantum dots 712 and a respective semiconductor 715, similar, respectively, to second set of quantum dots 112 and semiconductor 115.

Second solar cell 702 located on substrate 720, and first solar cell 701 is located on second solar cell 702 (e.g. second solar cell 702 is between substrate 720 and first solar cell 701). In general, first solar cell 701 is transparent to wavelengths that are absorbed by second solar cell 702 and/or wavelengths that are converted by second solar cell 702 to an electrical output, such that wavelengths (for example in sunlight, and the like) to which second solar cell 702 are sensitive, pass through first solar cell 701 to reach second solar cell 702. Similarly, when substrate 720 is transparent, second solar cell 702 is transparent to wavelengths that are absorbed by first solar cell 701 and/or wavelengths that are converted by first solar cell 701 to an electrical output, such that wavelengths (for example in sunlight, and the like) to which first solar cell 701 are sensitive, pass through second solar cell 702 to reach first solar cell 701. Furthermore, ratios and/or compositions materials of semiconductors 713, 715 can be graded, for example near the interface there between, and/or semiconductors 713, 715 can each comprises layers of materials of different ratios and/or different compositions materials of semiconductors 713, 715, for example near the interface there between. Such grading and/or formation of layers of different ratios can occur during manufacture of semiconductors 713, 715 to assist in achieving target ratios in each of semiconductors 713, 715.

Solar panel 700 further comprises electrical connectors 721, 722, electrical connectors 721 configured to convey an electrical output from first set of quantum dots 711 out of solar panel 700, and electrical connectors 722 configured to convey an electrical output from second set of quantum dots 712 out of solar panel 700. Electrical connector 721 can be generally transparent to wavelengths that are absorbed by second solar cell 702 and/or wavelengths that are converted by second solar cell 702 to an electrical output, such that wavelengths (for example in sunlight, and the like) to which second solar cell 702 are sensitive, pass through electrical connector 721 to reach second solar cell 702. Furthermore, electrical connectors 721, 722 can be located at other positions in solar panel 700 that convey electrical output out of solar cells 701, 702, as will occur to persons of skill in the art. When substrate 720 is transparent, electrical connector 722 can be generally transparent to wavelengths that are absorbed by first solar cell 701 and/or wavelengths that are converted by first solar cell 701 to an electrical output, such that wavelengths (for example in sunlight, and the like) to which first solar cell 701 are sensitive, pass through electrical connector 722 (and second solar cell 702) to reach first solar cell 701. However, in other implementations, solar panel 700 can comprise one electrical connector (e.g. at a position of either of electrical connectors 721, 722, and/or another position), with electrical output from both solar cells 701, 702 flowing there through to the one electrical connector.

As compared to solar panels 100, 600, solar panel 700 has a comparative areal advantage as each of solar cells 701, 702 occupy an area that is similar to an area of solar panel 700 rather than about half the area (as in solar panels 100, 600).

Figure 8:
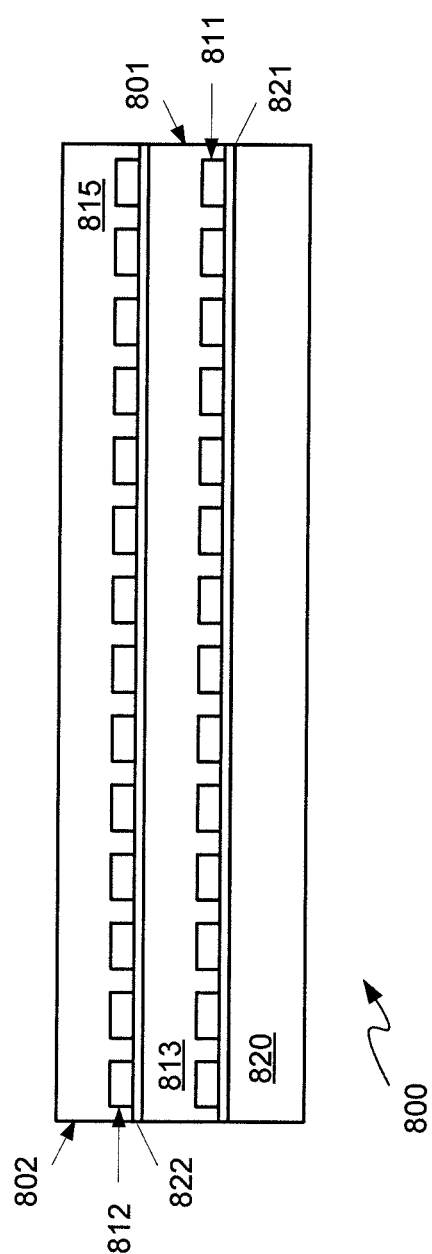
FIG. 8 depicts a solar panel that includes quantum dots in semiconductors and stacked solar cells, according to alternative non-limiting implementations.

In some implementations, relative positions of solar cells 701, 702 can be reversed. For example, attention is next directed to FIG. 8, which depicts a solar panel 800 that is substantially similar to solar panel 700, with like elements having like numbers, however in a "800" series rather than a "700" series. In particular, solar panel 800 comprises a substrate 820, a first solar cell 801 and a second solar cell 802. As also depicted in FIG. 8, first solar cell 801 comprises a respective set of quantum dots 811 and a respective semiconductor 813, similar, respectively, to first set of quantum dots 111 and semiconductor 113; and second solar cell 802 comprises a respective set of quantum dots 812 and a respective semiconductor 815, similar, respectively, to second set of quantum dots 112 and semiconductor 115.

However, in contrast to solar panel 700, in solar panel 800, first solar cell 801 is located on substrate 820, and second solar cell 802 is located on first solar cell 801 (e.g. first solar cell 801 is between substrate 820 and second solar cell 802). In general, second solar cell 802 is transparent to wavelengths that are absorbed by first solar cell 801 and/or wavelengths that are converted by first solar cell 801 to an electrical output, such that wavelengths (for example in sunlight, and the like) to which first solar cell 801 are sensitive, pass through second solar cell 802 to reach first solar cell 801. Similarly, when substrate 820 is transparent, first solar cell 801 is transparent to wavelengths that are absorbed by second solar cell 802 and/or wavelengths that are converted by second solar cell 802 to an electrical output, such that wavelengths (for example in sunlight, and the like) to which second solar cell 802 are sensitive, pass through first solar cell 801 to reach second solar cell 802.

Solar panel 800 further comprises electrical connectors 821, 822, electrical connector 821 configured to convey an electrical output from first set of quantum dots 811 out of solar panel 800, and electrical connector 822 configured to convey an electrical output from second set of quantum dots 812 out of solar panel 800. Electrical connector 822 can be generally transparent to wavelengths that are absorbed by first solar cell 801 and/or wavelengths that are converted by first solar cell 801 to an electrical output, such that wavelengths (for example in sunlight, and the like) to which first solar cell 801 are sensitive, pass through electrical connector 822 to reach first solar cell 801. When substrate 820 is transparent, electrical connector 821 can be generally transparent to wavelengths that are absorbed by second solar cell 802 and/or wavelengths that are converted by second solar cell 802 to an electrical output, such that wavelengths (for example in sunlight, and the like) to which second solar cell 802 are sensitive, pass through electrical connector 821 (and first solar cell 801) to reach second solar cell 802. However, in other implementations, solar panel 800 can comprise one electrical connector (e.g. at a position of either of electrical connectors 821, 822, and/or another position), with electrical output from both solar cells 801, 802 flowing there through to the one electrical connector.

Hence, provided herein are solar panels in which a first solar cell (e.g. solar cell 701 and/or solar cell 801) and a second solar cell (e.g. solar cell 702 and/or solar cell 802) are stacked on each other and on a substrate (e.g. substrate 820), an outer solar cell (e.g. a solar cell distal the substrate), of the first solar cell and the second solar cell, being transparent to respective wavelengths associated with an inner solar cell (e.g. a solar cell next to the substrate), of the first solar cell and the second solar cell. Furthermore, when the substrate can be transparent and the inner solar cell can transparent to respective associated wavelengths of the outer solar cell.

Figure 9:
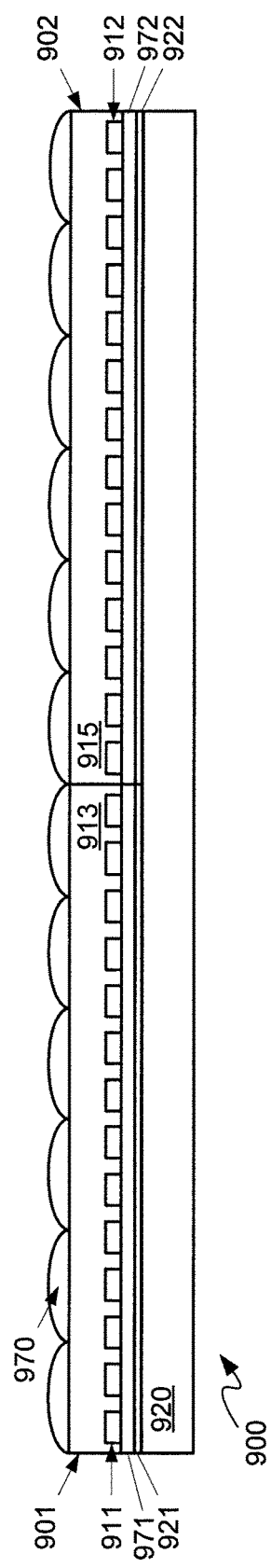
FIG. 9 depicts a solar panel that includes quantum dots in semiconductors, optional lenses, and optional reflective layers, according to alternative non-limiting implementations.

Yet further alternative implementations are within the scope of present implementations. For example, each of solar panels 100, 600, 700, 800 can be adapted to include lenses, including, but not limited to optical lenses and the like, and/or reflective layers, including, but not limited to, thin film coatings and/or partially reflective layers, and/or selectively reflective layers, and the like, to assist at increasing efficiency of the solar panels. For example, attention is next directed to FIG. 9, which depicts a solar panel 900 which is substantially similar to solar panel 100, with like elements having like numbers however in a "900" series rather than a "100" series. In particular, solar panel 900 comprises a substrate 920, a first solar cell 901 and a second solar cell 902. As also depicted in FIG. 9, first solar cell 901 comprises a respective set of quantum dots 911 and a respective semiconductor 913, similar, respectively, to first set of quantum dots 111 and semiconductor 113; and second solar cell 902 comprises a respective set of quantum dots 912 and a respective semiconductor 915, similar, respectively, to second set of quantum dots 112 and semiconductor 115. Solar panel 900 further electrical connectors 921, 922 similar to electrical connectors 121, 122.

However, in contrast to solar panel 100, solar panel 900 further comprises one or more lenses 970 configured to convey the sunlight, and the like into first solar cell 901 and second solar cell 902. Specifically, lenses 970 focus light into solar cells 901, 902. Again, lenses 970 are depicted in cross-section and lenses 970 can comprise an array of lenses arranged on a surface of each of first solar cell 901 and second solar cell 902. Furthermore, while six lenses 970 are depicted for each of first solar cell 901 and second solar cell 902, a number and/or size of lenses 970 can be adapted for a size and/or area of solar panel 100. Furthermore, lenses 970 can be configured with a focal point that results in sunlight, and the like being focussed into about a midway point between top and bottom surfaces of each of first solar cell 901 and second solar cell 902, however other focal points are within the scope of present implementations. For example, in some implementations, one or more lenses 970 can be configured with a focal point that results in sunlight, and the like being focussed into quantum dots 911, 912. In general, lenses 970 assist in collecting light from the sun, and/or light from other light sources, and conveying the light into each of first solar cell 901 and second solar cell 902.

Furthermore, when substrate 920 is transparent, an opposite and/or bottom side of substrate 920 can alternatively comprises lenses similar to lenses 970, however with respective focal points adjusted accordingly.

Also in contrast to solar panel 100, solar panel 900 comprises one or more reflective layers 971, 972 arranged to reflect sunlight, and the like passing through one or more of first solar cell 901 and second solar cell 902 back through one or more of first solar cell 901 and second solar cell 902. For example, as depicted, reflective layer 971 is located between solar cell 901 and electrical connector 921, and is configured to reflect light at least in first range 201 and, alternatively, light in second range 202 (and/or light in both ranges 201, 202) back into solar cell 901. Hence, light in one or more of ranges 201, 202 that was not converted to an electrical output can be reflected back into solar cell 901 for further conversion into an electrical output. Alternatively, reflective layer 971 can be integrated with electrical connector 921. Similarly, as depicted, reflective layer 972 is located between solar cell 902 and electrical connector 922, and is configured to reflect light at least in first range 401 and, alternatively, light in second range 402 (and/or light in both ranges 401, 402) back into solar cell 902. Hence, light in one or more of ranges 401, 402 that was not converted to an electrical output can be reflected back into solar cell 902 for further conversion into an electrical output. Alternatively, reflective layer 972 can be integrated with electrical connector 922. Reflective layers 971, 972 can include, but are not limited to, one or more of metal layers, mirror layers and dichroic mirror layers; when reflective layers 971, 972 comprise dichroic mirrors, the dichroic mirrors can be specifically adapted to reflect the respective wavelength ranges for each of solar cells 901, 902. It is further appreciated that any of lenses 970 and reflective layers 971, 972 can be optional.

Solar panel 600 can be adapted to include lenses and/or reflective layers similar to solar panel 900. Similarly, solar panels 700, 800 can be adapted to include lenses, at least at a top surface. When similar reflective layers are integrated with solar panels 700, 800, reflective layers configured to reflect light associated with a first solar cell can be farther configured to transmit light associated with the other solar cell. For example, in solar panel 700, a reflective layer located between solar cell 701 and solar cell 702 can be configured to reflect light associated with solar cell 701 and transmit light associated with solar cell 702.

Figure 10:
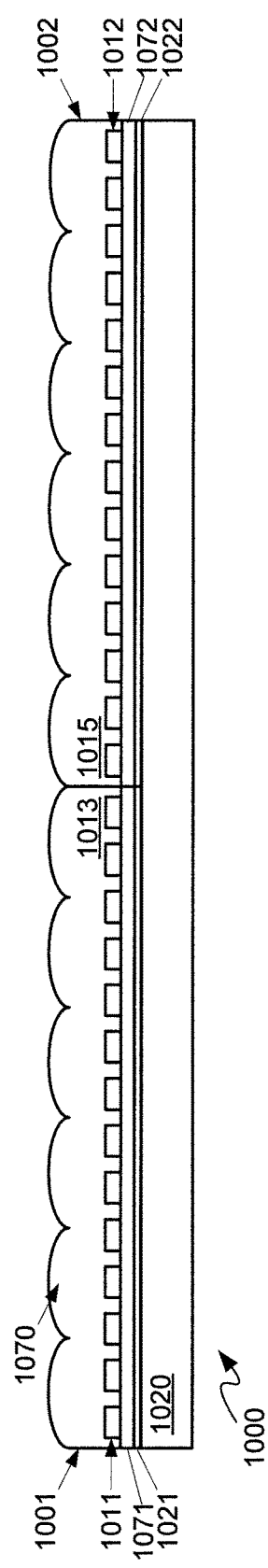
FIG. 10 depicts a solar panel that includes quantum dots in semiconductors shaped into one or more lenses, and optional reflective layers, according to alternative non-limiting implementations.

In some implementations, semiconductors described herein can be adapted to be in a shape of a lens configured to convey the sunlight, and the like into a respective solar cell. For example, attention is next directed to FIG. 10, which depicts a solar panel 1000 which is substantially similar to solar panel 1000, with like elements having like numbers however in a "1000" series rather than a "900" series. In particular, solar panel 1000 comprises a substrate 1020, a first solar cell 1001 and a second solar cell 1002. As also depicted in FIG. 10, first solar cell 1001 comprises a respective set of quantum dots 1011 and a respective semiconductor 1013, similar, respectively, to first set of quantum dots 111 and semiconductor 113; and second solar cell 1002 comprises a respective set of quantum dots 1012 and a respective semiconductor 1015, similar, respectively, to second set of quantum dots 112 and semiconductor 115. Solar panel 1000 further electrical connectors 1021, 1022 similar to electrical connectors 921, 922, as well as optional reflective layers 1071, 1072, respectively similar to optional reflective layers 971, 972

However, in contrast to solar panel 900, in solar panel 1000, a shape of each of semiconductors 1013, 1015 is in a shape of one or more lenses 1070 configured to convey the sunlight, and the like into a respective solar cell. For example, a side opposite substrate 1020 of each of semiconductors 1013, 1015 has been shaped into one or more lenses 1070, lenses 1070 being otherwise similar to lenses 970. Semiconductors in any of solar panels 100, 600, 700, 800 can be adapted accordingly. In particular, when semiconductors of solar panels 700, 800 are similarly adapted, a surface of a "top" semiconductor can be shaped into one or more lenses.

Persons skilled in the art will appreciate that there are yet more alternative implementations and modifications possible. For example, portions of semiconductors and/or quantum dots described herein can be coated with reflective layers and/or sandwiched between reflective layers, to contain light therein, to promote further conversion of light to charge; in addition portions of semiconductors and/or quantum dots described herein can be shaped in a manner which promotes total internal reflection ("TIR") through portions of the semiconductors to further contain light in specific wavelength ranges, to promote further conversion of light to charge.

Figure 11:
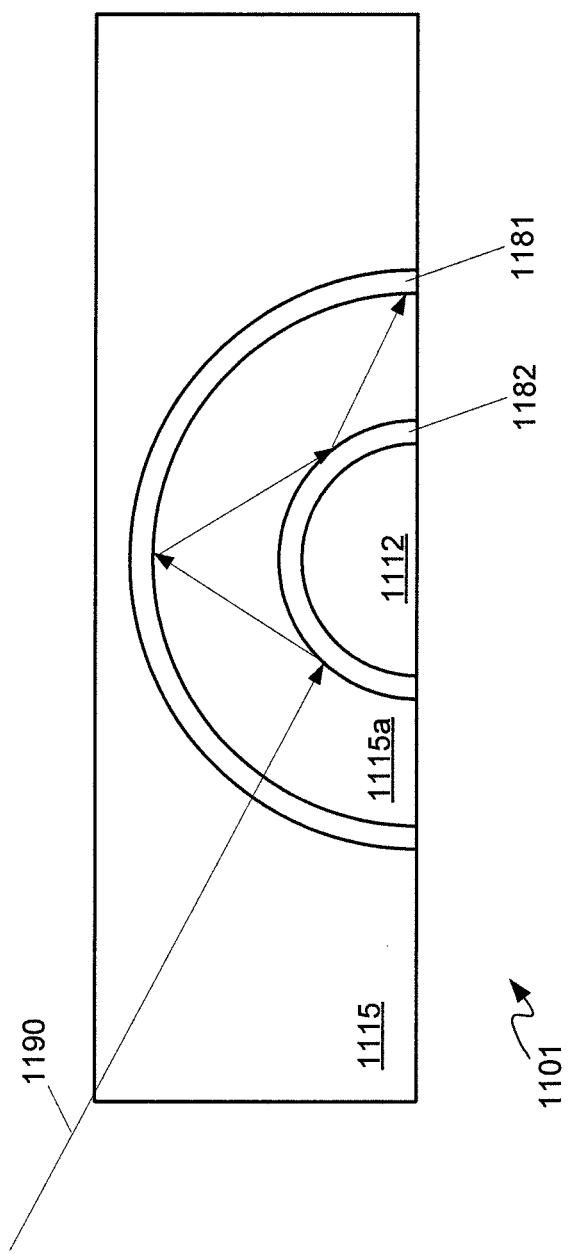
FIG. 11 depicts a solar cell that includes quantum dots in semiconductors, and reflective layers forming optical cavities adjacent quantum dots, according to alternative non-limiting implementations

For example, attention is next directed to FIG. 11 which depicts a cross-section of a portion of a solar cell 1101, which can be similar to either of solar cells 101, 102, and the like described herein. Hence, a set of quantum dots 1112 and a semiconductor 1115, however only one quantum dot 1112 is depicted for clarity (though it is assumed that a plurality of quantum dots 1112 is present). Furthermore, a shape of a cross-section of quantum dot 1112 is depicted as being semi-circular, though quantum dot 1112 can generally comprise mesa shape and the like. In any event, solar cell 1101 further comprises a first reflective layer 1181 and a second reflective layer 1182, which sandwich a portion 1115a of semiconductor 1115 there between, and portion 115a having a cross-section which is half-annulus. Hence, for example, reflective layer 1182 coats quantum dot 1112, portion 1115a coats reflective layer 1182, reflective layer 1181 coats portion 1115a, and reflective layer 1181 is capped by semiconductor 1115. In general, reflective layer 1181 is at least partially transparent to wavelengths in light 1190 to which semiconductor 1115 is sensitive (e.g. as described above) and is generally transparent to wavelengths to which quantum dot 1112 is sensitive. Light 1190 can comprise light from sunlight, ambient light, light from radiant sources present at night and the like. Reflective layer 1182 is generally reflective to wavelengths in light 1190 to which semiconductor 1115 is sensitive (e.g. as described above) and is generally transparent to wavelengths to which quantum dot 1112 is sensitive. Hence, for example, infrared light (or UV light), and the like, enters the optical cavity formed by reflective layers 1181, 1182 and is converted to red light (or blue light, though neither is depicted for clarity, but assumed to be present) by portion 1115a, which in turn passes through reflective layer 1182 where it is converted to an electrical output by quantum dot 1112. However, infrared light (or UV light) that is not converted to red light reflects from reflective layer 1182 back into the optical cavity formed by reflective layers 1181, 1182 and is either reflected again into the cavity by partially reflective layer 1181 (e.g. when reflective layer is at least partially reflective of infrared light (or UV light) and/or reflected again into the cavity when a reflection angle is greater than or equal to a total internal reflection angle. Such an optical cavity can increase the efficiency of solar cell 1101 relative to solar cells without reflective layers 1181, 1182 as infrared light (or UV light) is reflected through the cavity increasing an interaction path with portion 1115a of semiconductor 1115. In general, each quantum dot in solar cell 1101 can be associated with an optical cavity of an associated portion of semiconductor 1115 formed by associated pairs of reflective layers similar to reflective layers 1181, 1182.

In any event, described herein are solar panels that include solar cells that convert light just outside the edges of the human visible spectrum into light just inside the human visible spectrum, which is turn converted into respective electrical outputs, using quantum dots in semiconductors. The ranges of light that are converted to electrical outputs are also in a range used by leaves in photosynthesis, and hence the solar panels described herein can also be referred to biomimicry devices. Furthermore, such solar panels described herein can be adapted for use in space and/or high-altitude applications, for example, where infrared and/or ultraviolet intensities in ambient radiation can be higher than on the earth's surface, as well as polar applications, underground applications and the like.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A solar panel comprising:
   a first solar cell comprising: a first set of quantum dots in a first semiconductor, the first semiconductor configured to receive one or more of ambient light and sunlight and emit first wavelengths in a first range of about 450 nm to about 480 nm, wherein the first semiconductor is configured to absorb at least a first portion of the one or more of ambient light and sunlight and in response emit the first wavelengths in the first range, the first portion having a respective wavelength smaller than about 450 nm, the first set of quantum dots configured to convert the first wavelengths to a first electric output, the first set of quantum dots doped with an N-type material with absorption in the first range;
   a second solar cell comprising: a second set of quantum dots in a second semiconductor, the second semiconductor configured to receive one or more of the ambient light and the sunlight and emit second wavelengths in a second range of about 600 nm to about 700 nm, wherein the second semiconductor is configured to absorb at least a second portion of the one or more of ambient light and sunlight and in response emit the second wavelengths in the second range, the second portion having a respective wavelength larger than about 700 nm, the second set of quantum dots configured to convert the second wavelengths to a second electric output, the second set of quantum dots doped with a P-type material with absorption in the second range; and,
   a substrate, the first solar cell and the second solar cell being side-by-side on the substrate in a planar arrangement such that a respective top surface of each of the first solar cell and the second solar cell receives one or more of the ambient light and the sunlight without the one or more of the ambient light and the sunlight first passing through the other of the first solar cell and the second solar cell,
   the first range and the second range comprising wavelength ranges used in photosynthesis;
   wherein one or more of:
   at least one quantum dot in the first set of quantum dots is coated by a first reflective layer;
   the first reflective layer is coated by a first layer of the first semiconductor; and
   the first layer of the first semiconductor is coated by a second reflective layer;
   and
   at least one quantum dot in the second set of quantum dots is coated by a corresponding first reflective layer;
   the corresponding first reflective layer is coated by a corresponding first layer of the second semiconductor; and
   the corresponding first layer of the second semiconductor is coated by a corresponding second reflective layer.

2. The solar panel of claim 1, wherein the first wavelengths define a spectrum centered in the first range, and the second wavelengths define a respective spectrum centered in the second range.

3. The solar panel of claim 1, wherein the first semiconductor is further configured to convert one or more of ultraviolet (UV) light and near-ultra-violet (NVR) light in one or more of the ambient light and the sunlight to the first wavelengths.

4. The solar panel of claim 1, wherein the second semiconductor is further configured to convert one or more of infrared (IR) light and near-IR (NIR) light in one or more of the ambient light and the sunlight to the second wavelengths.

5. The solar panel of claim 1, further comprising one or more electrical connectors to the first set of quantum dots and the second set of quantum dots, the one or more electrical connectors configured to: convey the first electric output out of the first solar cell; and convey the second electric output out of the second solar cell.

6. The solar panel of claim 1, further comprising: a substrate; a plurality of first solar cells, including the first solar cell, each of the plurality of first solar cells similar to the first solar cell; and, a plurality of second solar cells, including the second solar cell, each of the plurality of second solar cells similar to the second solar cell, the plurality of first solar cells and the plurality of second solar cells arranged on the substrate.

7. The solar panel of claim 1, wherein the first semiconductor comprises one or more of: GaN, InGaN, and AlGaN and the second semiconductor comprises one or more of: InGaN, AlInGaN, and InGaAlP.

8. The solar panel of claim 1, wherein the first set of quantum dots are doped with one or more of: Si, Ge, Cr, S, Fe, Mn, Zn, and the second set of quantum dots are doped with one or more of Mg, Be, Ba, Cr, Al, Fe.

9. The solar panel of claim 1, wherein the first semiconductor comprises $In_xGa_{(1-x)}N$, where x is in a range of about 0.0 to about 0.10.

10. The solar panel of claim 1, wherein the second semiconductor comprises $In_xGa_{(1-x)}N$, where x is in a range of about 0.60 to about 0.75.

11. The solar panel of claim 1, wherein the second semiconductor comprises materials configured to convert infrared light to the second wavelengths in the second range.

12. The solar panel of claim 1, further comprising one or more respective lenses on the respective top surface of each of the first solar cell and the second solar cell, the one or more respective lenses configured to convey one or more of the ambient light and the sunlight into the first solar cell and the second solar cell.

13. The solar panel of claim 1, wherein the respective top surface of each of the first semiconductor and the second semiconductor is in a shape of one or more respective lenses configured to convey the one or more of the ambient light and sunlight into a respective solar cell.

14. The solar panel of claim 1, further comprising one or more additional reflective layers arranged to reflect one or more of the ambient light and the sunlight passing through one or more of the first solar cell and the second solar cell back through one or more of the first solar cell and the second solar cell.

15. The solar panel of claim 1, wherein:

the second reflective layer is at least partially transparent to a given portion of the one or more of ambient light and sunlight, the given portion being absorbable by the first semiconductor; and the first reflective layer is at least partially transparent to the first wavelengths and at least partially reflective of the given portion.

16. The solar panel of claim 15, wherein the first layer of the first semiconductor is substantially semi-annular in cross-section.

17. The solar panel of claim 1, wherein:

the corresponding second reflective layer is at least partially transparent to a given portion of the one or more of ambient light and sunlight, the given portion being absorbable by the second semiconductor; and the corresponding first reflective layer is at least partially transparent to the second wavelengths and at least partially reflective of the given portion.

18. The solar panel of claim 17, wherein the corresponding first layer of the second semiconductor is substantially semi-annular in cross-section.

* * * * *